United States Patent
Gillotti

(10) Patent No.: US 9,165,842 B2
(45) Date of Patent: Oct. 20, 2015

(54) SHORT TAIL RECOVERY TECHNIQUES IN WIRE BONDING OPERATIONS

(71) Applicant: Kulicke and Soffa Industries, Inc., Fort Washington, PA (US)

(72) Inventor: Gary S. Gillotti, North Wales, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 14/593,226

(22) Filed: Jan. 9, 2015

(65) Prior Publication Data
US 2015/0200143 A1 Jul. 16, 2015

Related U.S. Application Data

(60) Provisional application No. 61/927,688, filed on Jan. 15, 2014.

(51) Int. Cl.
| | |
|---|---|
| *B23K 31/02* | (2006.01) |
| *H01L 21/66* | (2006.01) |
| *H01L 23/00* | (2006.01) |
| *B23K 20/00* | (2006.01) |

(52) U.S. Cl.
CPC .............. *H01L 22/12* (2013.01); *B23K 20/004* (2013.01); *B23K 20/005* (2013.01); *B23K 20/007* (2013.01); *H01L 22/14* (2013.01); *H01L 24/85* (2013.01); *H01L 2224/4845* (2013.01); *H01L 2224/78821* (2013.01); *H01L 2224/851* (2013.01); *H01L 2224/859* (2013.01); *H01L 2224/85365* (2013.01)

(58) Field of Classification Search
None
See application file for complete search history.

(56) References Cited

U.S. PATENT DOCUMENTS

| 5,326,015 A | * | 7/1994 | Weaver | B23K 20/007 228/102 |
|---|---|---|---|---|
| 2001/0004991 A1 | * | 6/2001 | Mochida | B23K 20/007 228/103 |
| 2003/0098426 A1 | * | 5/2003 | Hayata | B23K 20/004 250/559.34 |
| 2005/0133563 A1 | * | 6/2005 | Kim | B23K 20/004 228/4.5 |
| 2007/0187138 A1 | * | 8/2007 | Takahashi | H01L 24/78 174/257 |
| 2007/0187470 A1 | * | 8/2007 | Tei | B23K 20/004 228/180.5 |
| 2007/0246513 A1 | * | 10/2007 | Tei | H01L 24/85 228/101 |
| 2008/0023028 A1 | * | 1/2008 | Fujita | B08B 7/0035 134/1.1 |

(Continued)

FOREIGN PATENT DOCUMENTS

JP 63-136536 A * 6/1988

*Primary Examiner* — Kiley Stoner
(74) *Attorney, Agent, or Firm* — Stadley Ronon Stevens & Young, LLP

(57) ABSTRACT

A method of operating a wire bonding machine is provided. The method includes: detecting a short tail condition after formation of a wire bond formed using a wire bonding tool; providing a bond head assembly of a wire bonding machine at an xy location of the wire bonding machine, the bond head assembly carrying the wire bonding tool; lowering the bond head assembly toward a contact surface at the xy location with a wire clamp of the wire bonding machine closed; opening the wire clamp; decelerating the bond head assembly as it is lowered toward the contact surface such that a portion of a wire extends below a tip of the wire bonding tool; closing the wire clamp; and performing a test to determine if an end of the portion of the wire extending below the tip of the bonding tool is in contact with the contact surface.

21 Claims, 9 Drawing Sheets

(56) References Cited

U.S. PATENT DOCUMENTS

| | | | |
|---|---|---|---|
| 2008/0099532 A1* | 5/2008 | Nakao | B23K 20/005 228/102 |
| 2011/0101073 A1* | 5/2011 | Zhang | B23K 20/005 228/103 |
| 2012/0006882 A1* | 1/2012 | Gillotti | B23K 3/0623 228/111 |
| 2013/0098877 A1* | 4/2013 | Song | B23K 35/0261 219/69.11 |
| 2013/0180957 A1* | 7/2013 | Lee | B23K 20/007 219/69.12 |
| 2014/0131425 A1* | 5/2014 | Liu | B23K 3/08 228/104 |
| 2014/0246480 A1* | 9/2014 | Gillotti | H01L 22/14 228/102 |
| 2015/0008251 A1* | 1/2015 | Song | B23K 3/063 228/41 |
| 2015/0243627 A1* | 8/2015 | Akiyama | H01L 24/78 228/102 |

* cited by examiner

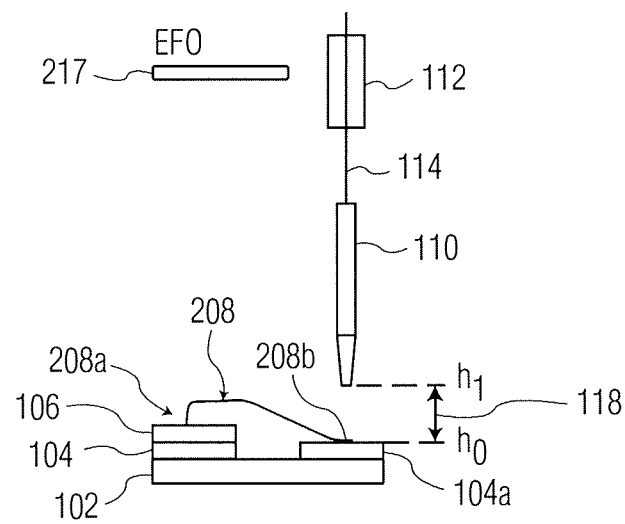
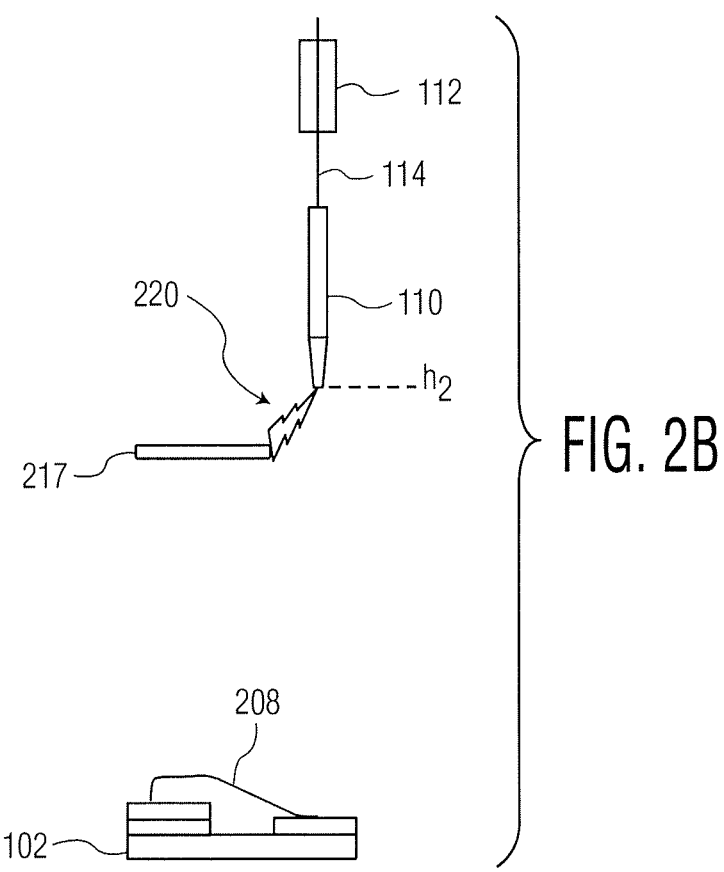
FIG. 2A
FIG. 2B

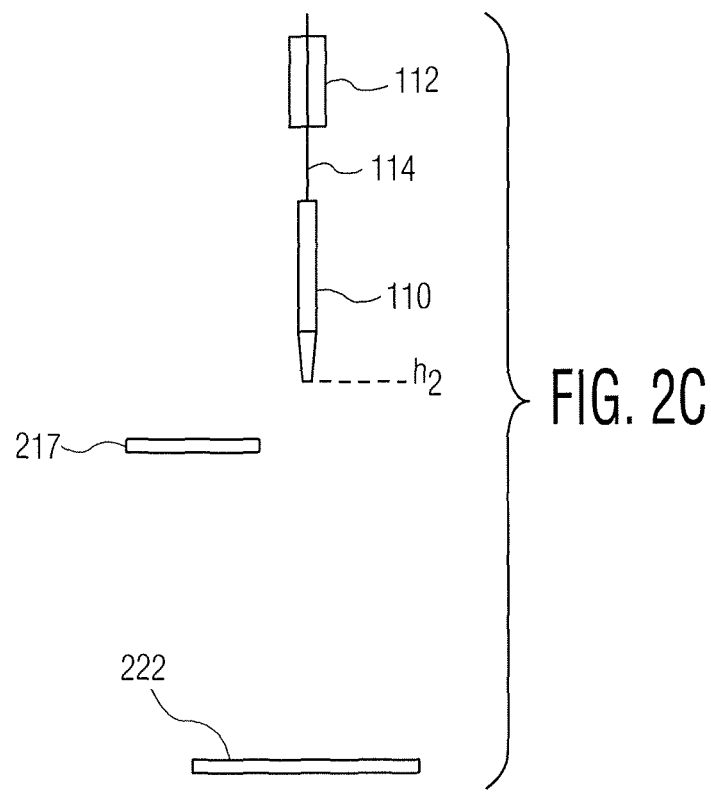
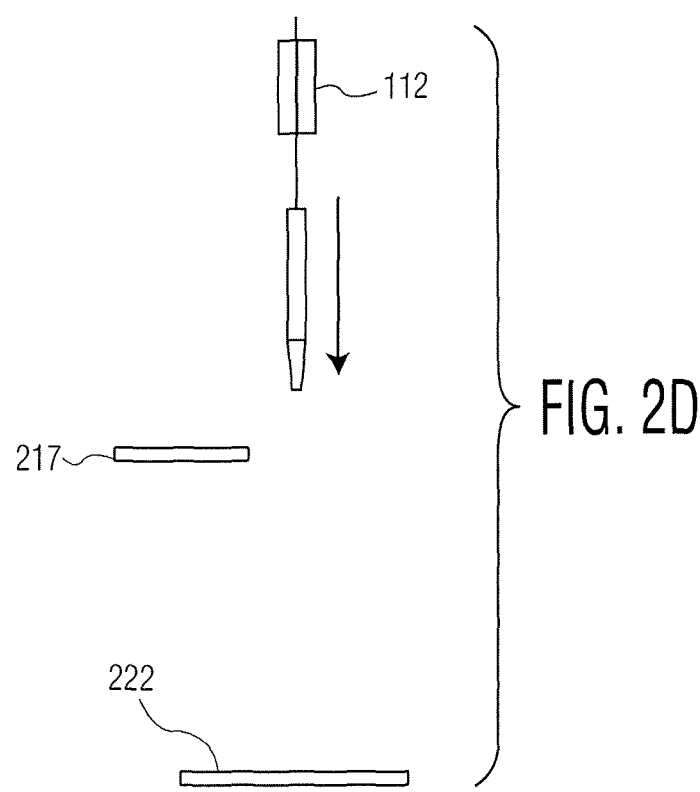

SHORT TAIL RECOVERY TECHNIQUES IN WIRE BONDING OPERATIONS

CROSS REFERENCE TO RELATED APPLICATION

This application claims the benefit of U.S. Provisional Patent Application No. 61/927,688 filed Jan. 15, 2014, the content of which is incorporated herein by reference.

FIELD OF THE INVENTION

The present invention relates to wire bonding operations (e.g., the formation of wire loops, the formation of conductive bumps, etc.), and in particular, to techniques for recovering from short tail conditions in wire bonding operations.

BACKGROUND OF THE INVENTION

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected. The primary methods of forming wire loops are ball bonding and wedge bonding. In forming the bonds between (a) the ends of the wire loop and (b) the bond site (e.g., a die pad, a lead, etc.) varying types of bonding energy may be used, including, for example, ultrasonic energy, thermosonic energy, thermocompressive energy, amongst others. Wire bonding machines (e.g., including stud bumping machines) are also used to form conductive bumps from portions of wire.

During ball bonding operations, a tail of wire extending from the tip of a bonding tool (e.g., a capillary) is melted into a free air ball using a spark from an electronic flame-off (EFO) device. The free air ball is then used to form a first bond (e.g., a ball bond) of a wire loop at a first bonding location, and then wire is extended from the ball bond to a second bonding location, where a second bond (e.g., a stitch bond) of the wire loop is formed by bonding a portion of the wire to the second bonding location using the bonding tool. For example, the first bonding location may be a bonding pad of a semiconductor chip, and the second bonding location may be a lead of a leadframe. The bonding tool may then be raised to a short tail detect height where the wire is tested (e.g., an electrical continuity test) to ensure it is still continuous with the stitch bond on the second bonding location. If a short tail is not detected, the bond head (i.e., carrying the bonding tool and a wire clamp, now closed) is raised to tear the wire at the stitch bond. The remaining tail length may then be used to form another free air ball for another wire loop.

Referring specifically to FIG. 1A, selected elements of wire bonding machine 100 are illustrated. Wire bonding machine 100 includes support structure 102 (e.g., a heat block, an anvil, etc.) that supports substrate 104. Substrate 104 includes contact portion 104a (which may be referred to herein as bonding location 104a). In a specific example, substrate 104 is a leadframe, and contact portion 104a may be a lead 104a of leadframe 104. Semiconductor die 106 is supported by substrate 104. Wire bonding machine 100 also includes bonding tool 110, wire clamp 112 (in an open position in FIG. 1A), wire 114, and detection system 116. Wire 114 is provided by a wire supply (e.g., a wire spool on wire bonding machine 100, not shown). Bonding tool 110 (e.g., a capillary) is used to form wire loop 108 between semiconductor die 106 and substrate 104. More specifically, first bond 108a of wire loop 108 has been bonded to a bonding location of semiconductor die 106. Likewise, second bond 108b of wire loop 108 has been bonded to a bonding location of contact portion 104a of substrate 104. In FIG. 1A, bonding tool is shown at a second bond formation height $h_0$.

After formation of wire loop 108, it is now time to form a wire tail for a subsequent wire loop. Referring now to FIG. 1B, bonding tool 110 has been raised (e.g., along with wire clamp 112 and other elements of a z-axis motion system of bonding machine 100, not shown) to a height $h_1$ (which may be referred to as "tail height" 118) such that wire tail 114a extends below bonding tool 110. At this time wire clamp 112 is closed, and detection system 116 is used to perform a continuity check. That is, as is known to those skilled in the art, detection system 116 senses electrical continuity in a circuit that includes wire clamp 112, wire tail 114a, second bond 108b, etc. That is, if wire tail 114a is still continuous with second bond 108b at $h_1$ (as shown in FIG. 1B), then electrical continuity is sensed and there is no short tail condition. Conversely, if wire tail 114a is not continuous with second bond 108b at $h_1$, then no electrical continuity is sensed and there is a short tail condition. Detection system 116 may be referred to as a bond integrity test system (i.e., a BITS system) on certain wire bonding machines.

Short tail conditions may result in a number of problems during wire bonding such as, for example, inconsistent free air ball size and shape. Thus, it would be desirable to provide improved short tail recovery techniques during wire bonding operations.

SUMMARY OF THE INVENTION

According to an exemplary embodiment of the present invention, a method of operating a wire bonding machine is provided. The method includes the steps of: (a) detecting a short tail condition after formation of a wire bond, the wire bond being formed using a wire bonding tool; (b) providing a bond head assembly of a wire bonding machine at an xy location of the wire bonding machine, the bond head assembly carrying the wire bonding tool; (c) lowering the bond head assembly toward a contact surface at the xy location with a wire clamp of the wire bonding machine closed; (d) opening the wire clamp; (e) decelerating the bond head assembly as it is lowered toward the contact surface such that a portion of a wire extends below a tip of the wire bonding tool; (f) closing the wire clamp; and (g) performing a test to determine if an end of the portion of the wire extending below the tip of the bonding tool is in contact with the contact surface. In one example, the xy location of the bond head assembly at step (b) may be a location above the detected short tail condition from step (a). In another example, the bond head assembly may be moved between step (a) and step (c) to the xy location, where the location is not directly above the detected short tail condition from step (a).

The methods of the present invention may also be embodied as an apparatus (e.g., as part of the intelligence of a wire bonding machine), or as computer program instructions on a computer readable carrier (e.g., a computer readable carrier including a wire bonding program used in connection with a wire bonding machine).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 2A-2K are a series of block diagram side views illustrating a short tail recovery technique in accordance with an exemplary embodiment of the present invention;

DETAILED DESCRIPTION OF THE INVENTION

In accordance with various exemplary embodiments of the present invention, a method of recovering from a "short tail" condition is provided. By providing for the recovery of the short tail, the overall mean time between assists (i.e., MTBA) of the machine is extended by recovering after a short tail has occurred. As detailed herein, after a short tail condition is detected, a process may be performed (e.g., using a software algorithm on the wire bonding machine) to control a z-axis motion system and a wire clamp to create a sequence where the wire is recovered after a short tail is detected.

As will be appreciated by those skilled in the art, certain motions of a wire bonding tool follow an acceleration/deceleration profile (e.g., an "S" curve). For example, during certain descending motions toward a workpiece, the wire bonding tool accelerates toward the workpiece. During the descent, the wire bonding tool decelerates while still being moved toward the workpiece. By opening a wire clamp during the descent of the wire bonding tool (in connection with a deceleration of the wire bonding tool, without air tension on the wire), inertia of the wire allows the wire to extend downward past the tip of the wire bonding tool to provide a more desirable wire tail (as opposed to a short tail).

Figure 1A:
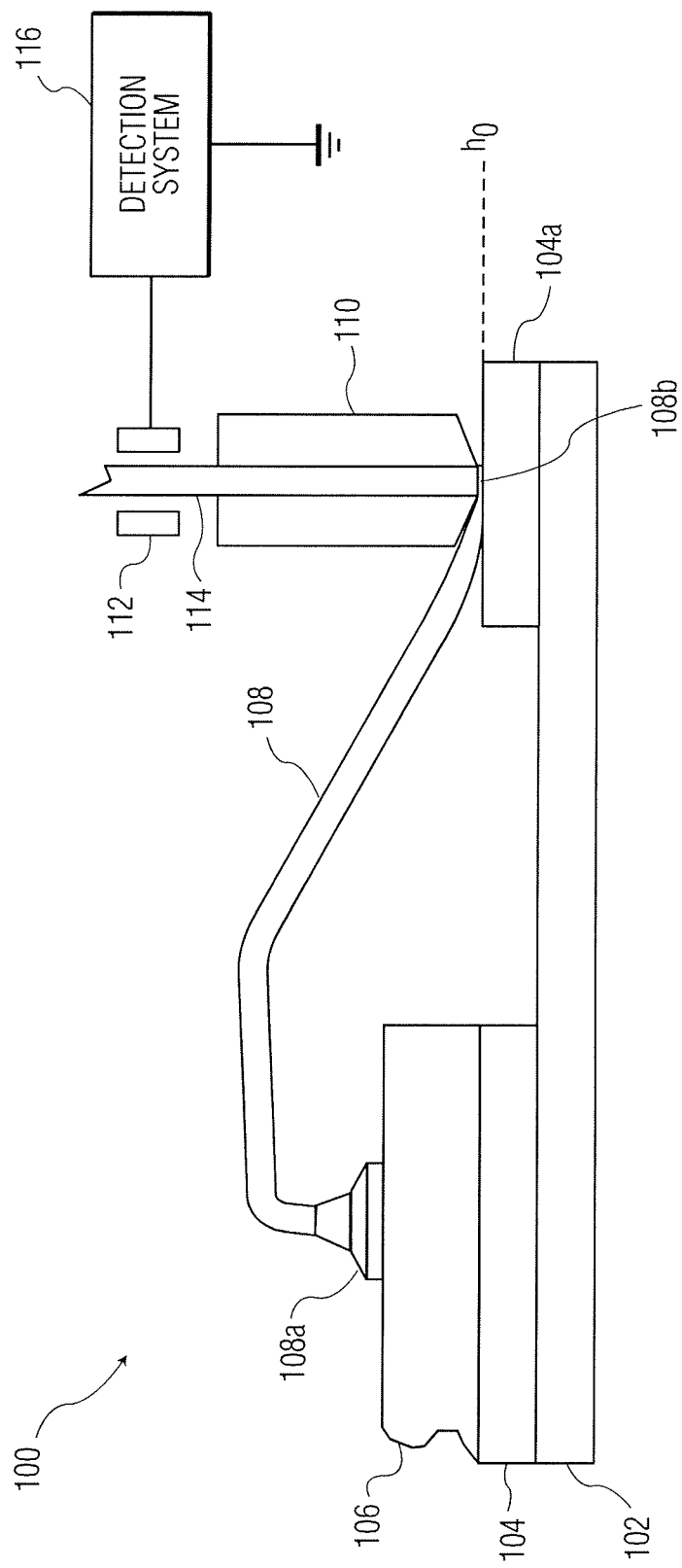
FIGS. 1A-1B are block diagram side views illustrating an exemplary prior art technique for detecting the presence, or absence, of a short tail condition.
Figure 1B:
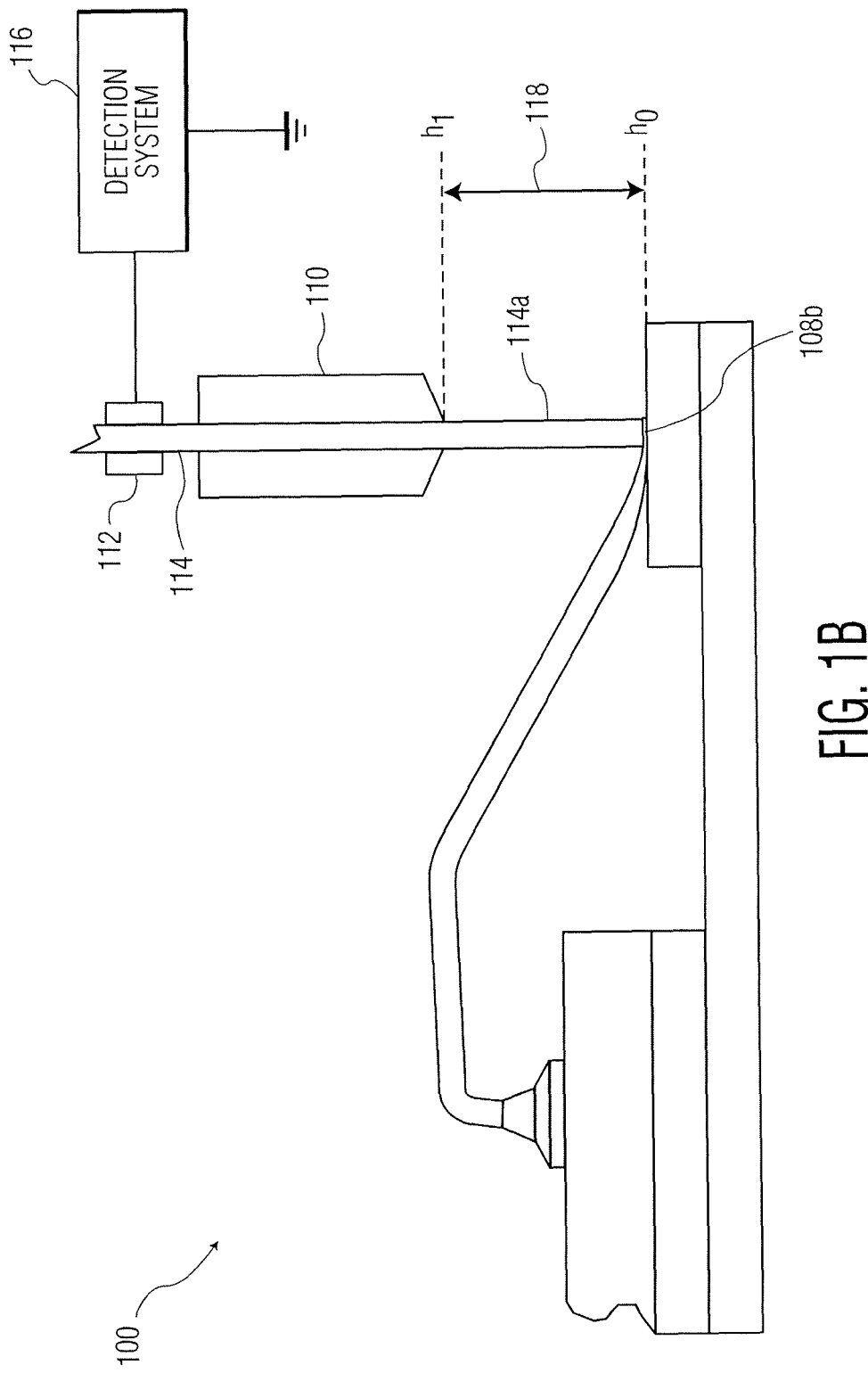
Figure 2E:
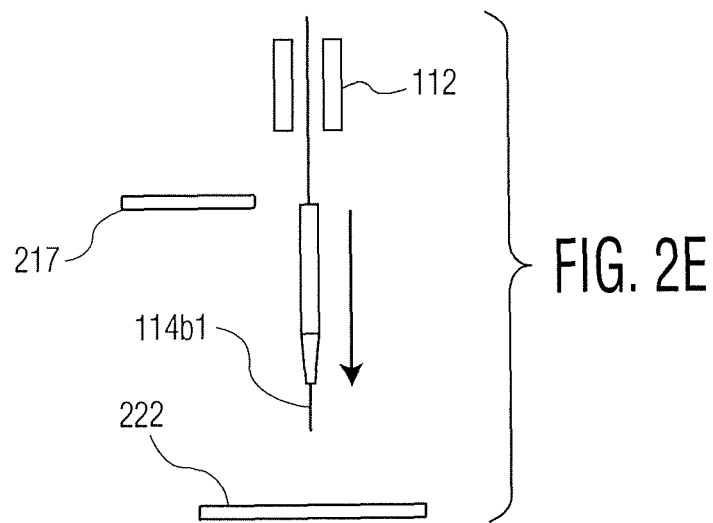

FIGS. 2A-2K illustrate some of the same elements of FIGS. 1A-1B. In FIG. 2A, wire bonding tool 110 is shown having already formed wire loop 208 (including first bond 208a on semiconductor die 106, and second bond 208b on bonding location 104a of substrate 104, where substrate 104 is supported by support structure 102). Electronic flame off device 217 (used for forming free air balls on wire tails) is also shown. In contrast to FIG. 1B, FIG. 2A illustrates a short tail condition. That is, after formation of wire loop 208, wire bonding tool 110 is raised to height $h_1$, and then (with wire clamp 112 closed) an electrical continuity check is performed (e.g., using detection system 116, not shown) to determine if a short tail condition is present (e.g., see description of FIGS. 1A-1B for an exemplary method of determining if a short tail condition is present). Since a short tail condition is present in FIG. 2A, a novel technique in accordance with the teachings of the present invention for recovering from the condition may be employed.

One reason for the short tail condition may be that wire 114 may be stuck at the lower tip of wire bonding tool 110. In such a situation, electronic flame off device 217 may be used to provide electrical arc 220 to loosen any wire 114 stuck in wire bonding tool 110, as shown in FIG. 2B. As will be appreciated by those skilled in the art, this step shown in FIG. 2B is optional. In any event, after the step shown in FIG. 2A (where the short tail condition is detected) wire bonding tool 110 is moved to a predetermined height (e.g., where the predetermined height may be flame-off height $h_2$ shown in FIG. 2B, or another predetermined height) using the z-axis motion system of the wire bonding machine 100 (not shown) to move the bond head assembly carrying wire bonding tool 110. Regardless of whether the step shown in FIG. 2B is performed, it may be desirable to move wire bonding tool 110 along the z-axis to the predetermined height (e.g., height $h_2$, or another predetermined height).

Wire bonding tool 110 may then be moved to a selected XY location of wire bonding machine 100. More specifically, short tail recovery techniques are performed in connection with a selected structure of wire bonding machine 100 (e.g., a back rail of an indexing system of wire bonding machine 100, a front rail of an indexing system of wire bonding machine 100, a device clamp of wire bonding machine 100, or another structure). In connection with such techniques, wire bonding tool 110 may be moved (e.g., using an XY table or other motion system for moving a bond head assembly carrying wire bonding tool 110) to the position shown in FIG. 2C above the selected structure 222 at the selected XY location. At some point in time before the descent of wire bonding tool 110 described below with respect to FIG. 2D, it is desirable to shut off one or more air/gas systems of the wire bonding machine. For example, wire bonding machines typically include a wire tensioner carried by the bond head assembly, and positioned above the wire bonding tool. This tensioner uses air pressure/vacuum to perform certain functions such as the "seating" of a free air ball at the tip of a capillary after free air ball formation. Wire bonding machines also typically include "air guide" structures which use air pressure in connection with the control of wire distribution. For example, the air guide may create a slack length of wire between the wire spool and the wire clamp. This slack length of wire is used to provide flexibility during rapid motions of the wire bonding tool (e.g., during wire looping motions). In any event, it may be desirable to shut off at least one of the wire tensioner and the air guide prior to the descent shown in FIG. 2D, such that the feeding of a wire tail (e.g., wire tail 114b shown and described below in connection with FIGS. 2E-2F) is practical using, for example, deceleration of the bond head assembly and an open wire clamp.

After wire bonding tool 110 is above structure 222 (e.g., at height $h_2$ or another predetermined height), wire bonding tool 110 descends (with wire clamp 112 in a closed position) towards structure 222 as shown in FIG. 2D. As the bond head assembly (shown in FIG. 3) carries each of wire bonding tool 110 and wire clamp 112, they move along the z-axis together. Wire clamp 112 is then opened, while the motion of wire bonding tool 110 along a z-axis toward structure 222 is decelerated. As provided above, the z-axis motion of wire bonding tool 110 may follow an acceleration/deceleration profile (e.g., an "S" curve) during the descent. The steps of opening wire clamp 112 and of decelerating wire bonding tool 110 may be accomplished concurrently (i.e., wire clamp 112 may be opened at least partially concurrently with the deceleration of wire bonding tool 110); alternatively, either of these two steps may be performed before the other as desired in the given application.

Figure 2F:
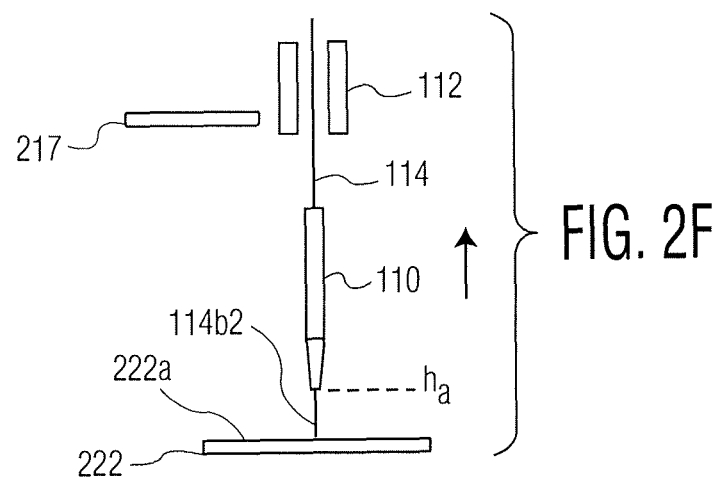
Figure 2G:
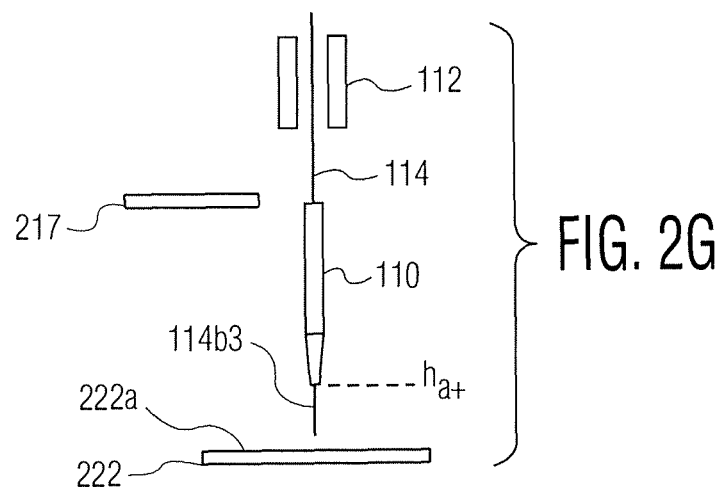

In connection with the acceleration/deceleration profile described above, during the deceleration of wire bonding tool 110, with wire clamp 112 open, the inertia of wire 114 may cause a portion of wire 114 to extend below a tip of wire bonding tool 110. More specifically, and as illustrated in FIG. 2E, this deceleration of wire bonding tool 110 allows wire tail 114b1 to extend below a tip of wire bonding tool 110. Wire bonding tool 110 then continues its descent to a predetermined height (e.g., to height $h_a$) where wire tail 114b1 is now somewhat longer (and labelled as wire tail 114b2) as shown in FIG. 2F. In order to further advance wire 114 past the tip of wire bonding tool 110 (in order to lengthen wire tail 114b2), wire bonding tool 110 may be raised slightly as shown by the upward arrow illustrated in FIG. 2F (in one example, on the order of 25-100 mils) through motion of the bond head assembly along the z-axis. This upward motion of wire bonding tool 110 (with wire clamp 112 still open) may tend to lengthen wire tail 114b2 below the tip of wire bonding tool 110. As shown in FIG. 2G, wire bonding tool has been raised to height $h_{a+}$, and the wire tail has now been lengthened and is labelled as wire tail 114b3. Wire clamp 112 may be closed at some time during this ascent to height $h_{a+}$, or at the end of this ascent, such that wire clamp 112 is closed at the point in time shown in FIG. 2H.

Figure 2H:
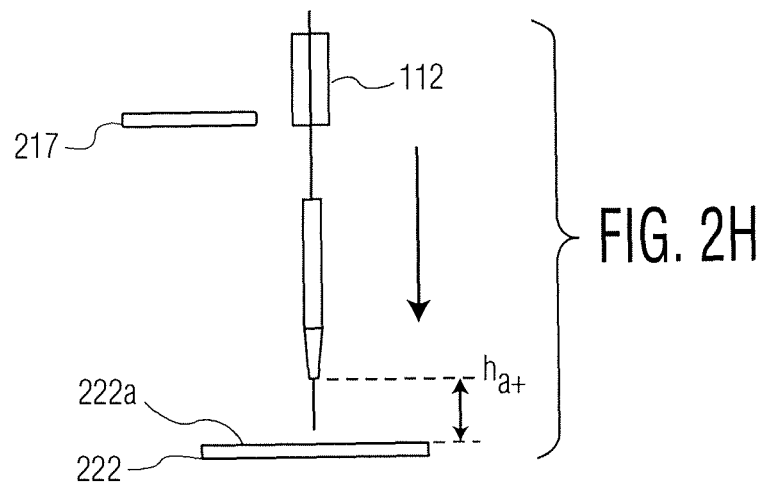
Figure 2I:
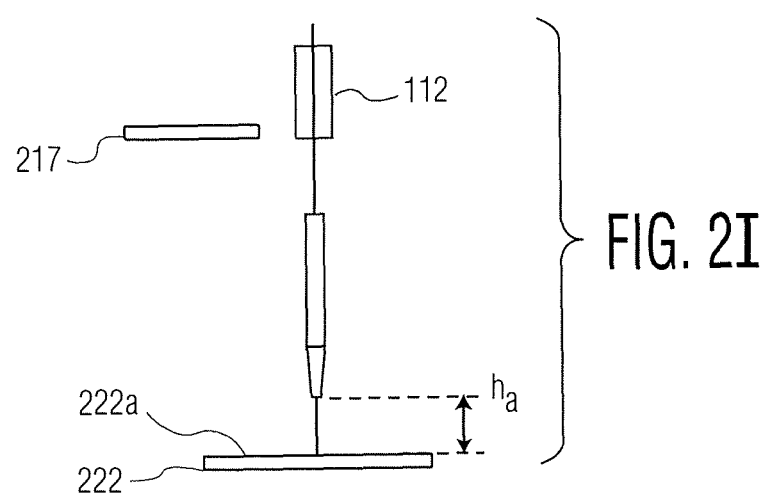

In FIG. 2H, with wire clamp 112 closed, an electrical continuity check is completed (e.g., using detection system 116 as described above with respect to FIGS. 1A-1B). In certain exemplary embodiments of the present invention, the continuity check may be performed when wire clamp 112 is closed. However, the bond head assembly may be lowered (thereby lowering wire bonding tool 110) to a different height before the continuity check is performed. FIGS. 2H-2I illustrate such as an example. More specifically, in FIG. 2H wire bonding tool 110 is being lowered (as shown by the downward arrow) from height $h_{a+}$ to a slightly lower height $h_a$ shown in FIG. 2I. Then, at height $h_a$ the continuity check is performed. As will be appreciated by those skilled in the art, wire bonding tool 110 may move downward during a continuity testing cycle incrementally (through motion of the bond head assembly along the z-axis) in a "seek" mode where contact between an end portion of the wire tail (e.g., wire tail 114b3) and contact surface 222a is sought.

Figure 2J:
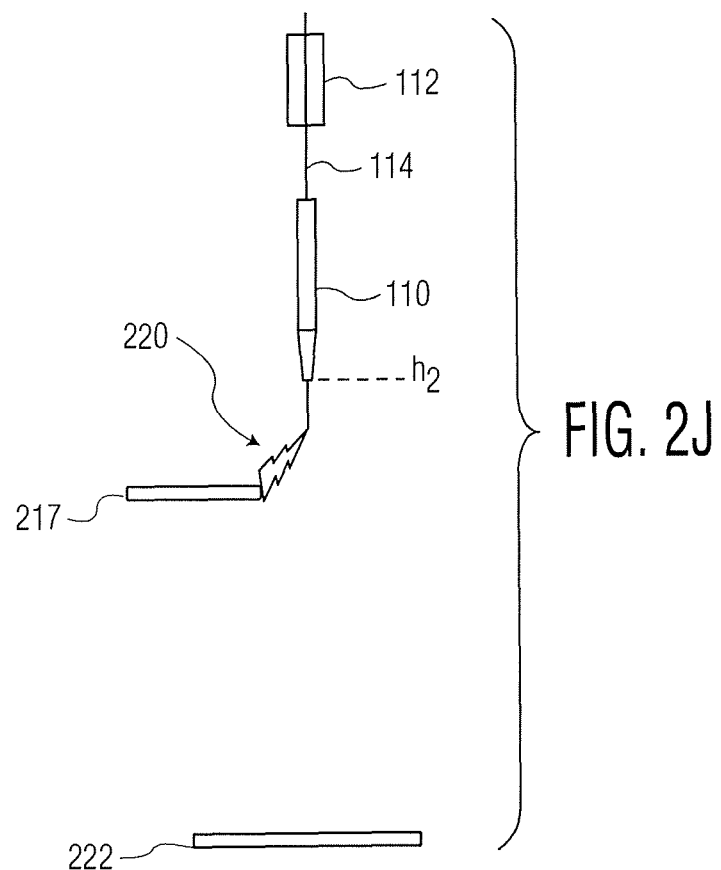
Figure 2K:
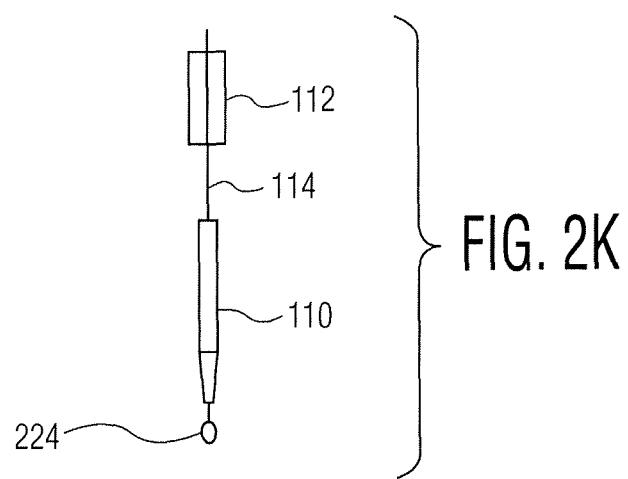

That is, an electrical continuity check is used to verify that the wire tail is present and of an adequate length to be in contact with contact surface 222a of structure 222. For example, an acceptable range of lengths for the wire tail may be considered during a closed loop "seek" process. As will be appreciated by those skilled in the art, contact surface 222a of structure 222 is desirably conductive and/or metallic, such that the electrical continuity test may be completed. If an adequate wire tail is verified, wire bonding tool 110 is raised to height $h_2$ (e.g., free air ball formation height $h_2$), where, as illustrated in FIG. 2J, electronic flame off device 217 is used to provide electrical arc 220 to form a free air ball as shown in FIG. 2K. Formed free air ball 224, shown in FIG. 2K, may now be used to form a bond of a subsequent wire loop, a subsequent conductive bump, etc. Height $h_2$ may be different than a typical free air ball formation height; that is, height $h_2$ may be adjusted depending upon the length of the wire tail as determined in the process above such that the end of the wire tail is appropriately positioned with respect to electronic flame off device 217.

In connection with the "seek" mode described above, an acceptable threshold height may be provided (e.g., programmed into the wire bonding system). That is, if continuity is not detected at the desired tail height, the bond head assembly may continually be lowered incrementally to "seek" continuity between the end of the wire tail and contact surface 222a. However, at some threshold height (e.g., a height equal to one half of the desired wire tail length) the descent during "seek" mode may be stopped, and a new recovery process may be initiated.

In addition to the techniques described above for providing a desirable wire tail (e.g., using inertia by decelerating the bond head assembly, etc.), additional techniques may be used in connection with the present invention. For example, ultrasonic energy may be applied. As is understood by those skilled in the art, wire bonding tools are typically coupled to an ultrasonic transducer included in the bond head assembly, where the ultrasonic transducer provides vibration/scrub to the tip of the bonding tool to form wire bonds. In connection with the present invention, such an ultrasonic transducer may be used, for example, to assist in moving a desired length of wire into the wire tail position. In a specific example, the ultrasonic transducer may be turned on at some point between the descent of the bonding tool (e.g., see FIGS. 2D-2E) and the closing of the wire clamps after a wire tail is desirably threaded through the bonding tool (e.g., see closed wire clamps 112 in FIG. 2H). The ultrasonic transducer may be operated in any desired method (e.g., toggled on/off, pulsed with a predetermined frequency, operated according to a predetermined energy profile, etc.) to apply ultrasonic energy to assist in threading the wire tail.

As will be appreciated by those skilled in the art, the process described above in connection with FIGS. 2A-2K (or any portion thereof) may be repeated a number of times. That is, a single operation (including the deceleration described above) may not be adequate to thread the desired wire tail length. For example, the operation may be repeated a desired maximum number of times (e.g., 10 times). If the desired wire tail length is not present after the maximum number of operations, then the machine may be stopped for the short tail condition and/or an operator may be alerted.

Figure 3:
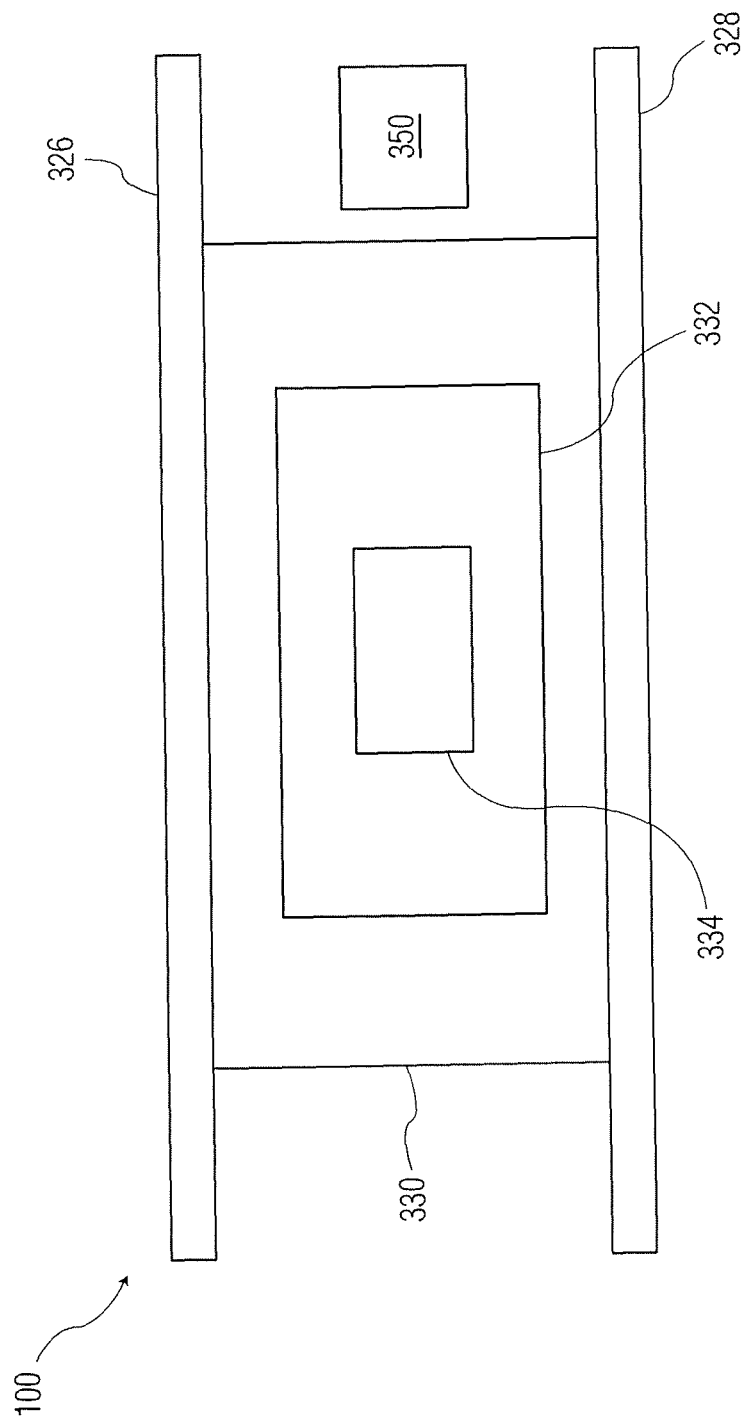
FIG. 3 is an overhead block diagram view of a portion of a wire bonding machine used in connection with certain exemplary embodiments of the present invention.

As will be appreciated by those skilled in the art, a number of different structures of wire bonding machine 100 may be used as structure 222. FIG. 3 is an overhead block diagram view of a portion of wire bonding machine 100 illustrating exemplary structures that may be used as structure 222. FIG. 3 illustrates leadframe strip 330 indexed in a position between front rail 328 and back rail 326. Device clamp 332 (defining aperture 334 through which a wire bonding operation is performed) secures a portion of leadframe strip 330 to support structure 102 (not shown in FIG. 3, but see, e.g., FIGS. 1A-1B). Each of front rail 328, back rail 326, and device clamp 332 may be used as structure 222, including a contact surface 222a for performing the verification of wire tail 114b through the electrical continuity test described above with respect to FIGS. 2C-2F. Of course, other portions of wire bonding machine 100 may also be suitable as structure 222. FIG. 3 also illustrates a bond head assembly 350 in block form, which carries certain elements illustrated in FIGS. 1A-1B and FIGS. 2A-2K, such as bonding tool 110 and wire clamp 112.

Figure 4:
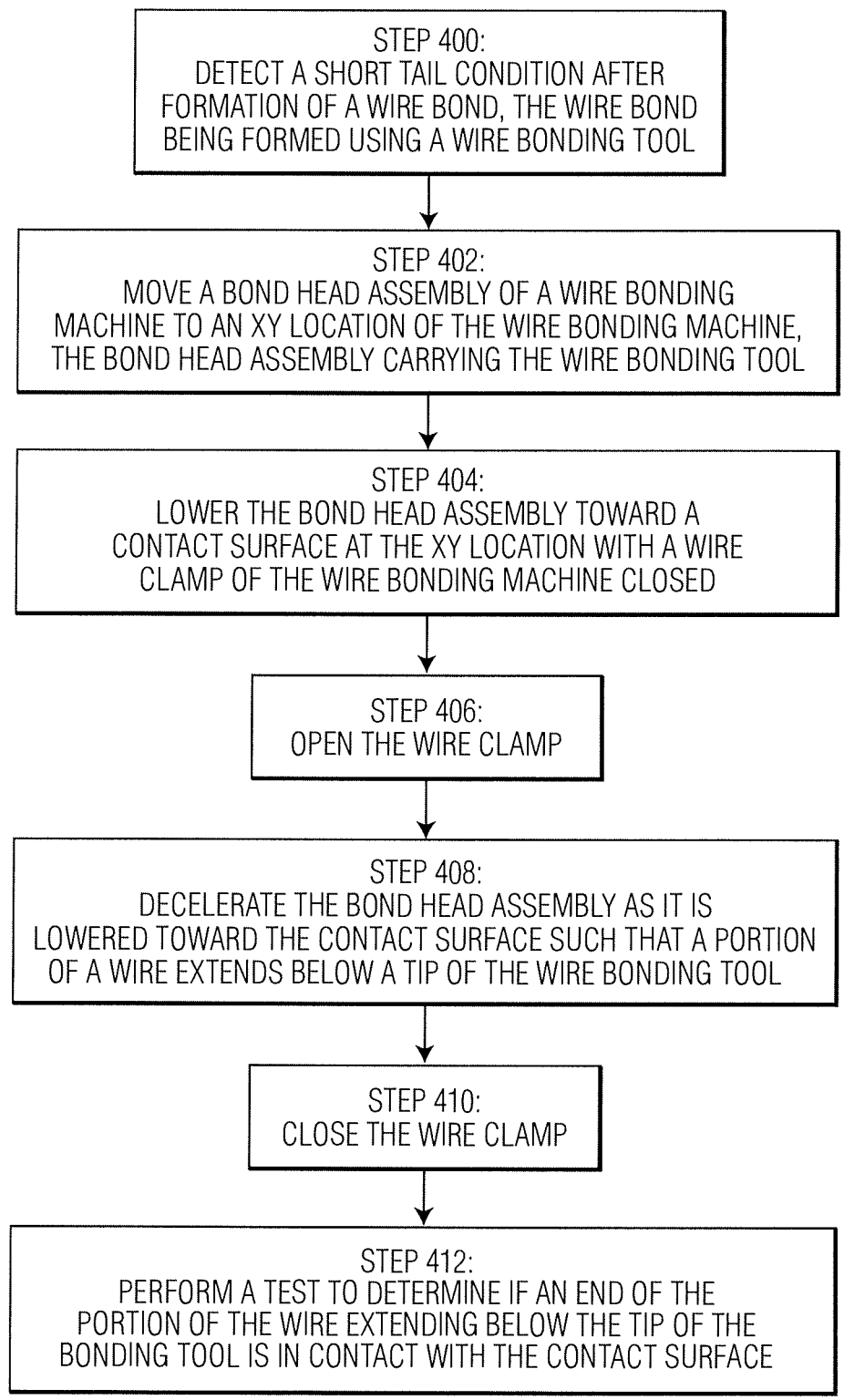
FIG. 4 is a flow diagram illustrating a method of operating a wire bonding machine in accordance with an exemplary embodiment of the present invention.

FIG. 4 is a flow diagram illustrating an exemplary method of operating a wire bonding machine. As is understood by those skilled in the art, certain steps included in the flow diagram may be omitted; certain additional steps may be added; and the order of the steps may be altered from the order illustrated.

In FIG. 4, at step 400, a short tail condition is detected after formation of a wire bond, the wire bond being formed using a wire bonding tool. The wire bond may be, for example, a second bond of a wire loop (e.g., see FIGS. 1B and 2A). In other examples, the wire bond may be: (a) a conductive bump formed on a wire bonding machine; or (b) the final bond of a stand-off stitch bonded (SSB) wire loop (where the SSB wire loop includes a conductive bump formed on a first bonding location of a workpiece, another wire bond on a second bonding location of the workpiece, a length of wire continuous with the another wire bond extended toward the conductive bump, and a portion of the length of wire bonded to the conductive bump to form final bond).

In step 400, the short tail condition may be detected using the techniques described above with respect to FIGS. 1A-1B (e.g., using detection system 116). After step 400, and before step 402, a number of optional steps may be performed. For example, an electronic flame off device of the wire bonding machine may be operated to direct an electric spark toward the tip of the wire bonding tool after step 400 but before step 402 (e.g., see FIG. 2B and related description). Additionally, the wire bonding tool may be raised along the z-axis of the wire bonding machine to a predetermined height (e.g., height $h_2$ shown in FIG. 2B) before step 402. At step 402, the bond head assembly of the wire bonding machine is moved to an xy location of the wire bonding machine. As will be appreciated by those skilled in the art, the bond head assembly may be used to carry a number of elements such as the wire bonding tool, the wire clamps, the electronic flame off assembly, etc. The bond head assembly may be moved, for example, using an XY table of the wire bonding machine. The xy location of the wire bonding machine to which the bond head assembly is moved is selected based on where the short tail recovery process is performed. For example, as shown in FIG. 2C, the bond head assembly may be moved to a position where wire bonding tool 110 is above structure 222 (where structure 222 includes contact surface 222a for performing the short tail recovery technique as shown in FIGS. 2F-2I). Structure 222 is desirably metallic and/or conductive, and may be, for example, a rail of an indexing system of the wire boding machine (e.g., back rail 326 or front rail 328 in FIG. 3) or a device clamp of the wire bonding machine (e.g., device clamp 332 in FIG. 3). As mentioned above with respect to FIGS. 2A-2K, in connection with the short tail recovery techniques disclosed herein, at some point in time it may be desirable to shut off one or more air/gas systems of the wire bonding machine. Referring to FIG. 4, it would be desirable to shut off one or more of the air/gas systems before the lowering of the wire bonding tool described below with respect to step 404. Of course, such systems would need to be restarted prior to the subsequent formation of wire bonds and wire loops.

At step 404, the bond head assembly is lowered toward a contact surface at the xy location with a wire clamp of the wire bonding machine in a closed position. For example, after wire bonding tool 110 is above the desired xy location (e.g., see FIG. 2C), the bond head assembly (carrying wire bonding tool 110 and wire clamp 112) is lowered toward a contact surface of structure 222 with wire clamp 112 in a closed position (e.g., see FIG. 2D). During the descent toward the contact surface, the wire clamp is opened at step 406 (e.g., see FIG. 2E). At step 408, the bond head assembly is decelerated as it is lowered toward the contact surface such that a portion of a wire extends below a tip of the wire bonding tool. As explained above, during an acceleration/deceleration profile (e.g., an "S" curve), a portion of the profile includes deceleration of the wire bonding tool during a given motion (e.g., a descending motion toward a workpiece). For example, in FIG. 2E wire tail 114b1 has extended below a tip of wire bonding tool 110 during the descent toward contact surface 222a of structure 222, because of this deceleration with wire clamp 112 in an open position. The exact order of these steps (e.g., the opening of the wire clamp at step 406, and the deceleration of the bond head assembly at step 408) may not be critical: that is, the two steps may be accomplished concurrently (i.e., the wire clamp may be opened at least partially concurrently with the deceleration of the wire bonding tool), or either of these two steps may be performed before the other as desired in the given application.

While not shown in FIG. 4, additional steps may be provided between step 408 and step 410. For example, after reaching a predetermined height (e.g., height $h_a$ in FIG. 2F), wire bonding tool may be raised slightly (e.g., to height $h_{a+}$ shown in FIG. 2G) before closing the wire clamp at step 410. By raising the wire bonding tool with the wire clamp still open, this may provide the additional benefit of additional length being added to the short tail (e.g., short tail 114b3 shown in FIG. 2G is longer than short tails 114b1/114b2 shown in FIGS. 2E-2F). Likewise, ultrasonic energy may be applied at some point in the process to assist in threading the wire tail, as described above.

In any event, at step 410 the wire clamp is closed (e.g., see FIG. 2H). Prior to step 412, the bond head assembly is stopped at a predetermined position (e.g., $h_{a+}$ shown in FIG. 2G). At step 412, a test is performed to determine if an end of the portion of the wire extending below the tip of the bonding tool is in contact with the contact surface. For example, FIG. 2I illustrates a continuity check to determine if the wire tail is in contact with contact surface 222a of structure 222. This will be confirmed by performing an electrical continuity test (e.g., using detection system 116 described in connection with FIGS. 1A-1B), so that it can be confirmed if the wire tail is present, and if the wire tail is long enough to make contact with contact surface 222a of structure 222. After step 410, but before step 412, the wire bonding tool may be lowered slightly in connection with a "seek" process, an example of which was described above in connection with FIGS. 2H-2I. In FIG. 2H, wire bonding tool 110 is being lowered from height $h_{a+}$ to height $h_a$ (in FIG. 2I) so that the continuity check can be performed. As provided above, the continuity check may involve multiple motions of wire bonding tool 110 (e.g., multiple incremental downward motions toward contact surface 222a) in order to determine if the wire tail is present, and if the length of the wire tail is within a satisfactory range.

If it is confirmed in step 412 that the end of the portion of the wire extending below the tip of the wire bonding tool is in contact with the contact surface (i.e., that the wire tail is present and of an adequate length), then the bond head assembly may be raised to height $h_2$ such that another free air ball may be formed (e.g., see FIGS. 2J-2K, and the formation of free air ball 224) for a subsequent bonding operation. Of course, if the test performed at step 412 indicates no contact between the portion of the wire extending below the tip of the wire bonding tool and the contact surface, then the process may be repeated (e.g., including any of the steps shown in FIGS. 2B-2I), or an operator may be summoned to the wire bonding machine.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of operating a wire bonding machine, the method comprising the steps of:
   (a) detecting a short tail condition after formation of a wire bond, the wire bond being formed using a wire bonding tool;
   (b) providing a bond head assembly of a wire bonding machine at an xy location of the wire bonding machine, the bond head assembly carrying the wire bonding tool;
   (c) lowering the bond head assembly toward a contact surface at the xy location with a wire clamp of the wire bonding machine closed;
   (d) opening the wire clamp;

(e) decelerating the bond head assembly as it is lowered toward the contact surface such that a portion of a wire extends below a tip of the wire bonding tool;

(f) closing the wire clamp; and (g) performing a test to determine if an end of the portion of the wire extending below the tip of the bonding tool is in contact with the contact surface.

2. The method of claim 1 wherein the wire bond includes a second bond of a wire loop.

3. The method of claim 1 wherein the wire bond includes a free air ball bond configured to be bonded as a conductive bump.

4. The method of claim 1 wherein an electronic flame off device of the wire bonding machine is operated to direct an electric spark toward the tip of the wire bonding tool after step (a) and before step (c).

5. The method of claim 1 wherein step (a) includes performing an electrical continuity test checking for electrical continuity between the wire bond and a portion of wire engaged with the wire bonding tool.

6. The method of claim 5 wherein the wire clamp of the wire bonding machine is in a closed position during the electrical continuity test, the wire clamp being a portion of a conductive path used to perform the electrical continuity test.

7. The method of claim 1 wherein step (g) includes performing an electrical continuity test between the end of the portion of the wire and the contact surface.

8. The method of claim 1 further comprising the step of turning off gas flow to at least one of a wire tensioner and an air guide of the wire bonding machine prior to step (c).

9. The method of claim 1 wherein each of steps (d) and (e) are performed at least partially concurrently.

10. The method of claim 1 wherein step (d) is performed before step (e).

11. The method of claim 1 wherein step (e) is performed before step (d).

12. The method of claim 1 wherein the contact surface is a conductive surface.

13. The method of claim 1 wherein the contact surface is a surface of a rail of an indexing system of the wire bonding machine.

14. The method of claim 1 wherein the contact surface is a surface of a device clamp of the wire bonding machine.

15. The method of claim 1 further comprising the step of forming a wire loop, before step (a), the wire loop including the wire bond as a second bond of the wire loop.

16. The method of claim 1 further comprising the step of forming a conductive bump on the wire bonding machine, before step (a), the conductive bump including the wire bond.

17. The method of claim 1 further comprising the steps of:
(h) forming a conductive bump on a first bonding location of a workpiece;
(i) forming another wire bond on a second bonding location of the workpiece;
(j) extending a length of wire continuous with the another wire bond toward the conductive bump; and
(k) bonding a portion of the length of wire to the conductive bump to form the wire bond referred to in step (a),
wherein each of steps (h)-(k) are completed before step (a).

18. The method of claim 1 wherein the wire bonding machine is configured to perform each of steps (b) through (g) automatically upon detecting the short tail condition in step (a).

19. The method of claim 1 wherein the step of lowering in step (c) is terminated upon the bond head assembly reaching a predetermined height after step (e).

20. The method of claim 19 further comprising the step of raising the bond head assembly before step (f) but after the step of lowering is terminated after the bond head assembly reaches the predetermined height.

21. The method of claim 1 further comprising the step of moving the bond head assembly of the wire bonding machine to the xy location of the wire bonding machine after step (a) but before step (b).

* * * * *